United States Patent
Oikawa

(10) Patent No.: US 10,193,528 B2
(45) Date of Patent: Jan. 29, 2019

(54) ACOUSTIC WAVE DEVICE AND ACOUSTIC WAVE MODULE

(71) Applicant: KYOCERA Corporation, Kyoto-shi, Kyoto (JP)

(72) Inventor: Akira Oikawa, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 382 days.

(21) Appl. No.: 15/025,527

(22) PCT Filed: Sep. 26, 2014

(86) PCT No.: PCT/JP2014/075564
§ 371 (c)(1),
(2) Date: Mar. 28, 2016

(87) PCT Pub. No.: WO2015/046402
PCT Pub. Date: Apr. 2, 2015

(65) Prior Publication Data
US 2016/0248399 A1   Aug. 25, 2016

(30) Foreign Application Priority Data

Sep. 26, 2013 (JP) .................................. 2013-199361

(51) Int. Cl.
*H03H 9/64* (2006.01)
*H03H 9/02* (2006.01)
(Continued)

(52) U.S. Cl.
CPC ............ *H03H 9/64* (2013.01); *H01L 41/047* (2013.01); *H01L 41/107* (2013.01);
(Continued)

(58) Field of Classification Search
CPC .... H03H 9/64; H03H 9/1071; H03H 9/02992; H01L 41/047; H01L 41/107
(Continued)

(56) References Cited

U.S. PATENT DOCUMENTS 6,282,781 B1 *  9/2001  Gotoh ................ H01L 21/4803
                                                         174/535
6,791,238 B2 *  9/2004  Kuratani ............ H03H 9/02629
                                                         310/313 D
(Continued)

FOREIGN PATENT DOCUMENTS

| JP | 2007-208665 A | 8/2007 |
| JP | 2010-056671 A | 3/2010 |
| JP | 2010-278972 A | 12/2010 |
| WO | 2005-099090 A1 | 10/2005 |

OTHER PUBLICATIONS

International Search Report dated Dec. 16, 2014, issued by the Japanese Patent Office for International Application No. PCT/JP2014/075564.

*Primary Examiner* — Bryan P Gordon
(74) *Attorney, Agent, or Firm* — Procopio Cory Hargreaves and Savitch LLP

(57) ABSTRACT

An acoustic wave device of the present invention has a piezoelectric substrate, an excitation electrode arranged on the piezoelectric substrate, an electrode pad arranged on the piezoelectric substrate and electrically connected to the excitation electrode, and a cover arranged on the piezoelectric substrate so that a oscillation space is arranged between the cover and the excitation electrode. The cover has inside it a via conductor electrically connected to the electrode pad and is curved so that its surface facing the piezoelectric substrate approaches the excitation electrode side with respect to an upper surface of the piezoelectric substrate from a position of contact with the via conductor.

10 Claims, 14 Drawing Sheets

(51) Int. Cl.
  *H03H 9/10* (2006.01)
  *H01L 41/047* (2006.01)
  *H01L 41/107* (2006.01)
  *H05K 1/18* (2006.01)
  *H03H 9/72* (2006.01)
  *H05K 3/34* (2006.01)

(52) U.S. Cl.
  CPC ...... *H03H 9/02897* (2013.01); *H03H 9/1071* (2013.01); *H05K 1/18* (2013.01); *H03H 9/02992* (2013.01); *H03H 9/725* (2013.01); *H05K 1/181* (2013.01); *H05K 3/3431* (2013.01); *H05K 2201/10083* (2013.01)

(58) Field of Classification Search
  USPC ...................................................... 310/313 R
  See application file for complete search history.

(56) References Cited

U.S. PATENT DOCUMENTS

| | | | |
|---|---|---|---|
| 8,564,172 B2* | 10/2013 | Seki | H03H 9/02842 310/313 A |
| 2002/0056897 A1* | 5/2002 | Yatsuda | H01L 21/50 257/678 |
| 2006/0202780 A1* | 9/2006 | Takamine | H03H 9/059 333/193 |
| 2010/0052472 A1* | 3/2010 | Nishino | H03H 3/02 310/313 D |
| 2010/0052473 A1* | 3/2010 | Kimura | H03H 9/059 310/313 R |
| 2012/0206014 A1* | 8/2012 | Bibl | B06B 1/0644 310/331 |
| 2014/0003196 A1* | 1/2014 | Tajima | G10K 11/18 367/140 |
| 2017/0358728 A1* | 12/2017 | Sekiya | H01L 23/29 |

* cited by examiner

ACOUSTIC WAVE DEVICE AND ACOUSTIC WAVE MODULE

TECHNICAL FIELD

The present invention relates to an acoustic wave device and an acoustic wave module.

BACKGROUND ART

Known in the past has been an acoustic wave device (surface acoustic wave device, hereinafter simply referred to as a "SAW device") in which excitation electrodes are formed on a piezoelectric substrate. This SAW device is used as a filter for obtaining a specific frequency by utilizing the feature that an electrical signal and a surface acoustic wave can be converted to each other due to the relationship between the excitation electrodes and the piezoelectric substrate.

In a duplexer which is used for a mobile terminal such as a mobile phone, conventionally a dielectric filter has been mainly used. In recent years, however, a SAW device which has a high performance and can be reduced in size and lightened in weight has begun to be used. A mobile terminal carries a SAW module comprised of a SAW device mounted on a circuit board on which a capacitor etc. are mounted. In the mobile terminal, the SAW module has the role of filtering an electrical signal transmitted and received from an antenna portion into a reception signal and a transmission signal by a duplexer.

In recent years, along with the increasingly smaller size of mobile terminals, lowering the profile of a SAW device has become indispensable. As a structure lowering the profile of a SAW device, for example, a wafer level package (hereinafter, simply referred to as WLP) structure is known (for example, see Japanese Patent Publication No. 2010-56671A). A WLP structure SAW device is structured with a cover having via conductors which are to be electrically connected to excitation electrodes formed on a piezoelectric substrate arranged on the piezoelectric substrate.

SUMMARY OF INVENTION

Technical Problem

In this regard, a WLP structure SAW device is mounted on the circuit board so that the cover side becomes the bottom, therefore the cover requires shock resistance at the time of mounting.

The present invention was conceived under circumstances explained above and has as its object to provide an acoustic wave device capable of improving the shock resistance of the cover.

Solution to Problem

An acoustic wave device of the present invention has a piezoelectric substrate, an excitation electrode, an electrode pad, and a cover. The excitation electrode is arranged on the piezoelectric substrate. The electrode pad is arranged on the piezoelectric substrate and is electrically connected to the excitation electrode. The cover is arranged on the piezoelectric substrate so that a oscillation space is arranged between the cover and the excitation electrode. The cover has inside it a via conductor electrically connected to the electrode pad and is curved so that its surface facing the piezoelectric substrate approaches the excitation electrode side.

Advantageous Effects of Invention

According to the present invention, an acoustic wave device capable of improving the shock resistance of the cover can be provided.

DESCRIPTION OF EMBODIMENTS

Figure 1:
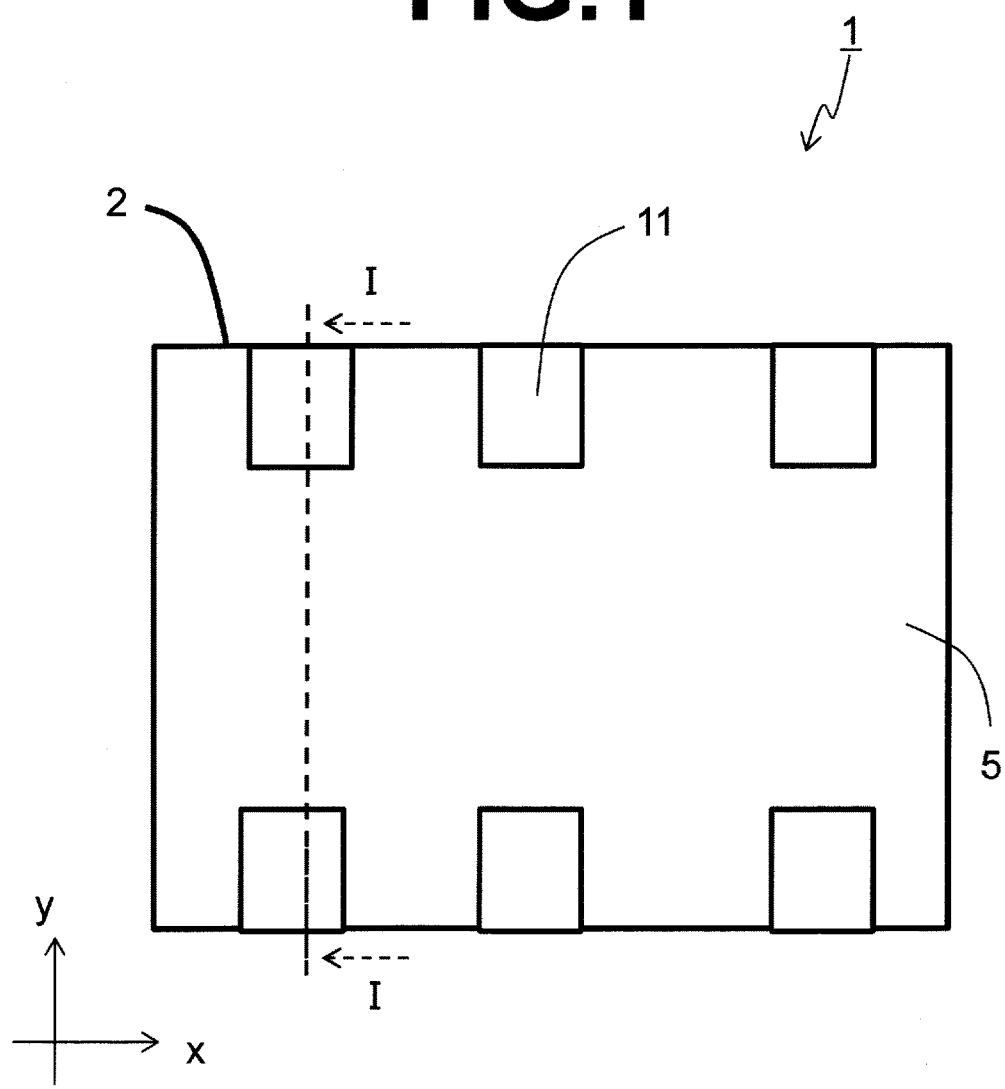
FIG. 1 is a plan view of the outline of a SAW device according to an embodiment of the present invention.
Figure 2:
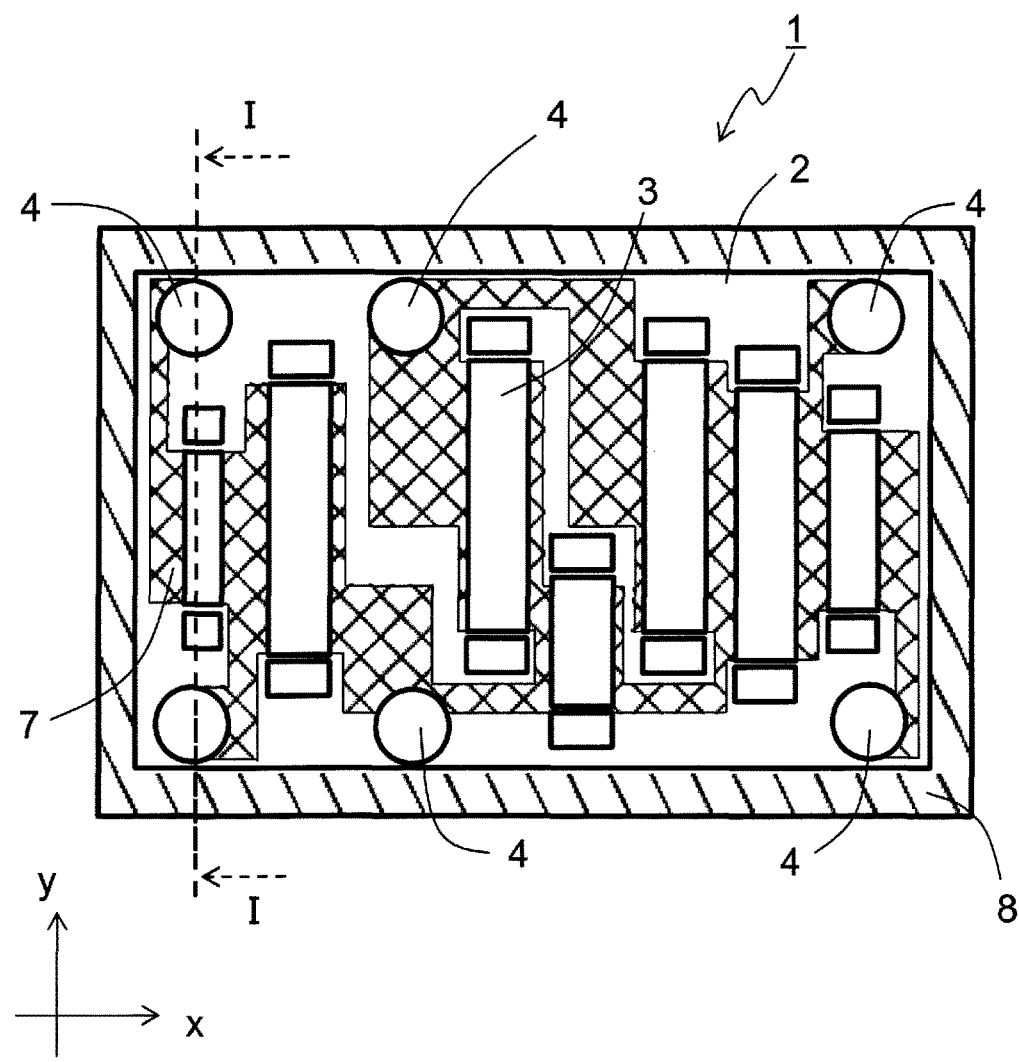
FIG. 2 is a plan view when detaching a cover in the SAW device in FIG. 1.

Below, a SAW device according to an embodiment of the present invention will be explained with reference to the drawings. Note that, the diagrams used in the following explanation are schematic ones, and dimension, ratios, etc. in the drawings do not always coincide with the actual ones.

Configuration of SAW Device

A SAW device according to an embodiment of the present invention will be explained below. A SAW device 1 according to the present embodiment, as shown in FIGS. 1 to 9 and 11 to 14, has a piezoelectric substrate 2, excitation electrodes 3, electrode pads 4, a cover 5, and via conductors 6.

The various parts of the SAW device 1 can be formed at the wafer level. The SAW device 1, in a mobile terminal, has the function of filtering an electrical signal which is exchanged between an antenna portion and a signal operation circuit (for example IC).

The SAW device 1 has a plurality of electrode pads 4. A signal is input through any electrode pad 4 among them. The input signal is filtered by the excitation electrodes 3 etc. Further, the SAW device 1 outputs the filtered signal through the electrode pads 4 among the plurality of electrode pads 4 other than the electrode pad 4 at which the input signal entered.

The piezoelectric substrate 2 is configured by a substrate of a single crystal having piezoelectricity such as a lithium tantalate single crystal, lithium niobate single crystal, or lithium tetraborate single crystal. The piezoelectric substrate 2 is for example formed in a shape like a rectangular parallelepiped and has an upper surface 2A and second major surface 2B which are rectangular in shape, parallel to each other, and flat. The piezoelectric substrate 2 may be suitably set in size. The piezoelectric substrate 2 can be set so that the thickness is for example 0.2 mm to 0.5 mm. In the piezoelectric substrate 2, the length of one side can be set to for example 0.6 mm to 3 mm.

Figure 3:
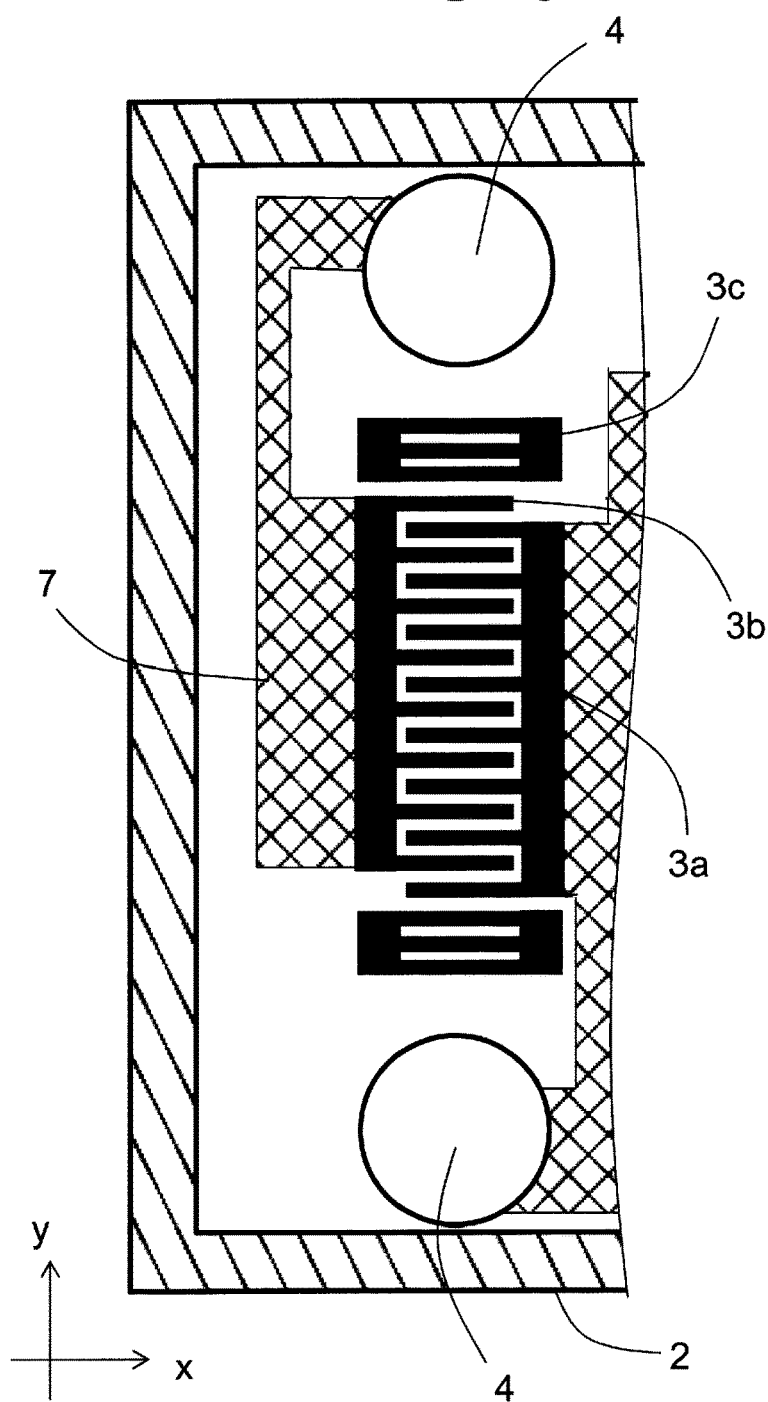
FIG. 3 is a plan view enlarging a portion of the SAW device in FIG. 2.
Figure 4:
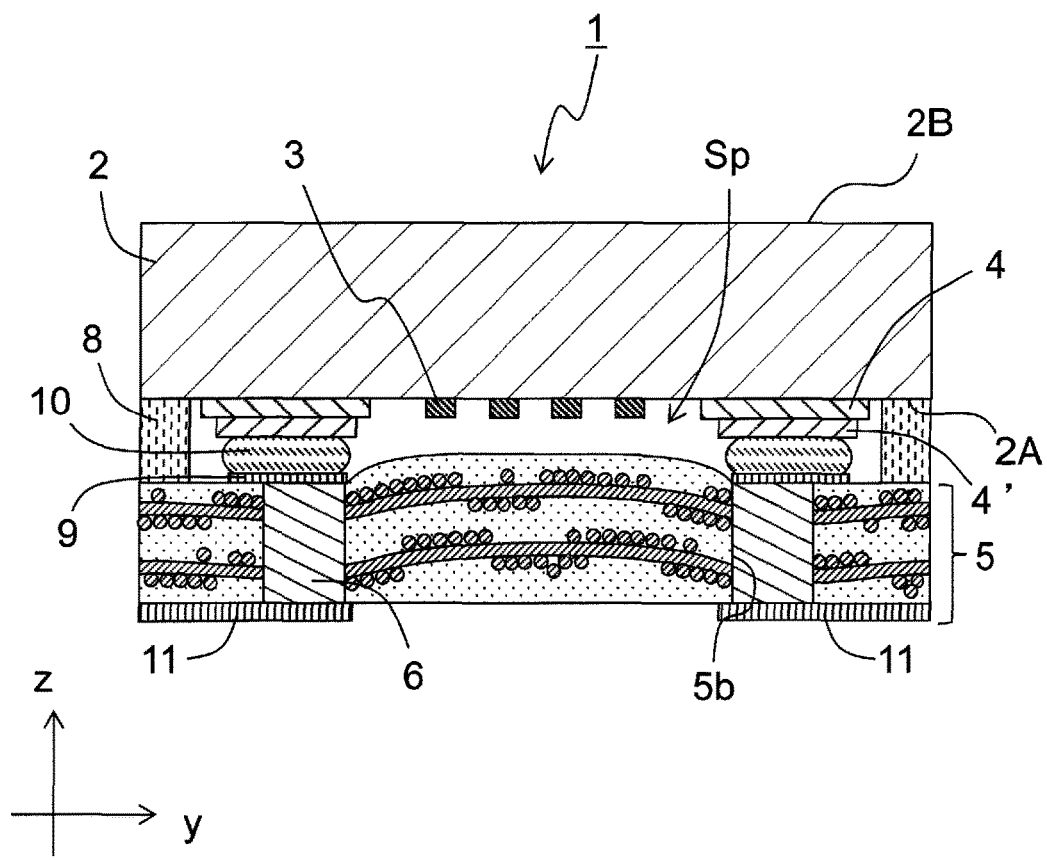
FIG. 4 corresponds to a cross-section when cutting the SAW device in FIG. 1 along the line I-I.

The excitation electrodes 3 are provided on the piezoelectric substrate 2. The excitation electrodes 3 are configured as comb-shaped electrodes as shown in FIG. 3. In the following explanation, these will be sometimes shown as the "comb-shaped electrodes 3". the comb-shaped electrodes 3 have at least two bus bar electrodes 3a arranged so as to face each other and electrode fingers 3b extending to the direction of the other side and crossing each other. The plurality of comb-shaped electrodes 3 may configure a ladder type SAW filter connected by direct connection or parallel connection as well. Further, the plurality of comb-shaped electrodes 3 may configure a dual mode SAW resonator filter in which a plurality of excitation electrodes 3 are arranged in one direction as well.

The electrode pads 4 are arranged on the piezoelectric substrate 2 as shown in FIG. 3 etc. The shape of the electrode pads 4 when viewed by a plan view may be suitably set. In the present embodiment, the electrode pads 4 are circular in shape. The number and arrangement positions of the electrode pads 4 may be suitably set in accordance with the configuration of the filter configured by the plurality of excitation electrodes 3. The width of the electrode pads 4 can be set so as to be for example 60 μm to 100 μm.

The electrode pads 4 are electrically connected to the excitation electrodes 3 by lines 7 as shown in FIG. 3. The lines 7 are formed on the upper surface 2A in a layer state and electrically connect the bus bar electrodes 3a of the excitation electrodes 3 with the electrode pads 4. Note that, the lines 7 do not have to be formed on the upper surface 2A and may have for example portions which cross at different levels through an insulator.

The excitation electrodes 3, electrode pads 4, and lines 7 (portions formed on the upper surface 2A) can be formed in the same manufacturing process. For this reason, the excitation electrodes 3, electrode pads 4, and lines 7 are for example configured by the same conductive material. As the conductive material, for example use can be made of an Al alloy such as an Al—Cu alloy. Further, the excitation electrodes 3, electrode pads 4, and lines 7 are for example set to the same thicknesses. The thicknesses can be set to for example 100 nm to 500 nm.

The excitation electrodes 3, lines 7, and electrode pads 4 can be formed by photolithography using a reduction projection exposure apparatus (stepper) or RIE (reactive ion etching) apparatus from a metal film formed according to a thin film forming method such as a sputtering process, vapor deposition process, CVD (chemical vapor deposition) process.

A protective film may be formed on the excitation electrodes 3, lines 7, and electrode pads 4 as well. The protective film is configured by an insulating material. For example, use can be made of silicon dioxide ($SiO_2$), silicon nitride ($Si_3N_4$), silicon (Si) or the like. The thickness of the protective film can be set to 5 nm to 50 nm.

The protective film can be obtained by using photolithography to pattern a film formed according to a thin film forming method such as the CVD process or sputtering process. By forming such a protective film, the excitation electrodes 3 and lines 7 can be protected and made resistant against oxidation. Note that, the protective film is provided so that the upper surfaces of the electrode pads 4 are exposed.

The protective film may be formed over the entire upper surface 2A as well. In this case, a sealing resin 8 which will be explained later may be arranged between the cover 5 and the protective film. Due to this, a difference in thermal expansion coefficient between the cover 5 and the sealing resin 8 can be made smaller than the difference in thermal expansion coefficient between the sealing resin 8 and the piezoelectric substrate 2. Therefore, peeling can be made harder to occur due to the difference of the thermal expansion coefficient. As a result, adhesion of the sealing resin 8 can be improved.

On the electrode pads 4, in order to improve the adhesion with the later explained bumps 10 or improve the electrical characteristics, connection electrodes 4' formed by laminating metal materials may be arranged as well. The thickness of the connection electrodes 4' can be set so as to become for example 1 μm to 2 μm. Such connection electrodes 4' can be formed by the lift-off method. As the material of the connection electrodes 4', a suitable material may be selected. When metal bumps made of copper are used as the bumps 10, for example, use can be made of a material obtained by laminating titanium and copper in that order.

The cover 5 is arranged on the piezoelectric substrate 2. The cover 5 can be configured by a ceramic board made of a ceramic material, an organic substrate made of an organic material, a film-shaped member made of a photosensitive material, or the like. The cover 5 is arranged so that a oscillation space Sp is formed between the cover 5 and the excitation electrodes 3. The present embodiment shows the case where the cover 5 is configured by an organic substrate.

As the organic substrate configuring the cover 5, for example use can be made of a substrate configured by arranging fibers 5a made of glass or the like in a base material made of an organic material such as an epoxy resin. The fibers 5a extend in the surface direction (xy-direction) of the cover 5. Fibers 5a extending in the x-direction and fibers 5a extending in the y-direction are woven together so as to exhibit a mesh state when viewed by a plan view. By providing the fibers 5a in this way, force received when mounting the SAW device 1 can be allowed to easily escape in the surface direction by transmission through the fibers 5a, therefore the stress is dispersed and thus the shock resistance of the cover 5 can be improved. Note that, the cover 5 need not have fibers 5a.

The thickness of the cover 5 can be set so as to become for example 80 μm to 300 μm. The width in the surface direction of the cover 5 can be set so as to become for example 0.6 mm to 3 mm. The elastic modulus of the cover 5 can be set so that for example the Young's modulus in the y-direction in FIG. 4 becomes about 20 GPa to 40 GPa. The organic substrate configuring the cover 5 may be a single layer substrate or multi-layer substrate. In the case of a multi-layer substrate, the substrate can be set so that the thickness of 1 layer becomes for example 40 μm to 60 μm. The present embodiment shows a case where the cover 5 is formed by one layer of organic substrate.

The cover 5 has via holes 5b. The via holes 5b are arranged so that their peripheries become smaller than the peripheries of the later explained second electrode pads 9. The via holes 5b may be vertical or may be inclined with respect to the electrode pads 4. When the via holes 5b are inclined, the adhesion with the later explained via conductors 6 can be improved.

The via conductors 6 are arranged in the via holes 5b and are electrically connected to the electrode pads 4. That is, the via conductors 6 are arranged inside the cover 5. For the via conductors 6, for example, use can be made of copper, silver paste, a conductive resin, etc. They are arranged so that portions of the via conductors 6 are exposed from the cover 5. When copper is used as the via conductors 6, they can be formed by using an electroplating method. When silver paste or a conductive resin is used as the via conductors 6, they can be formed by using a printing method or dispensing method.

Figure 5:
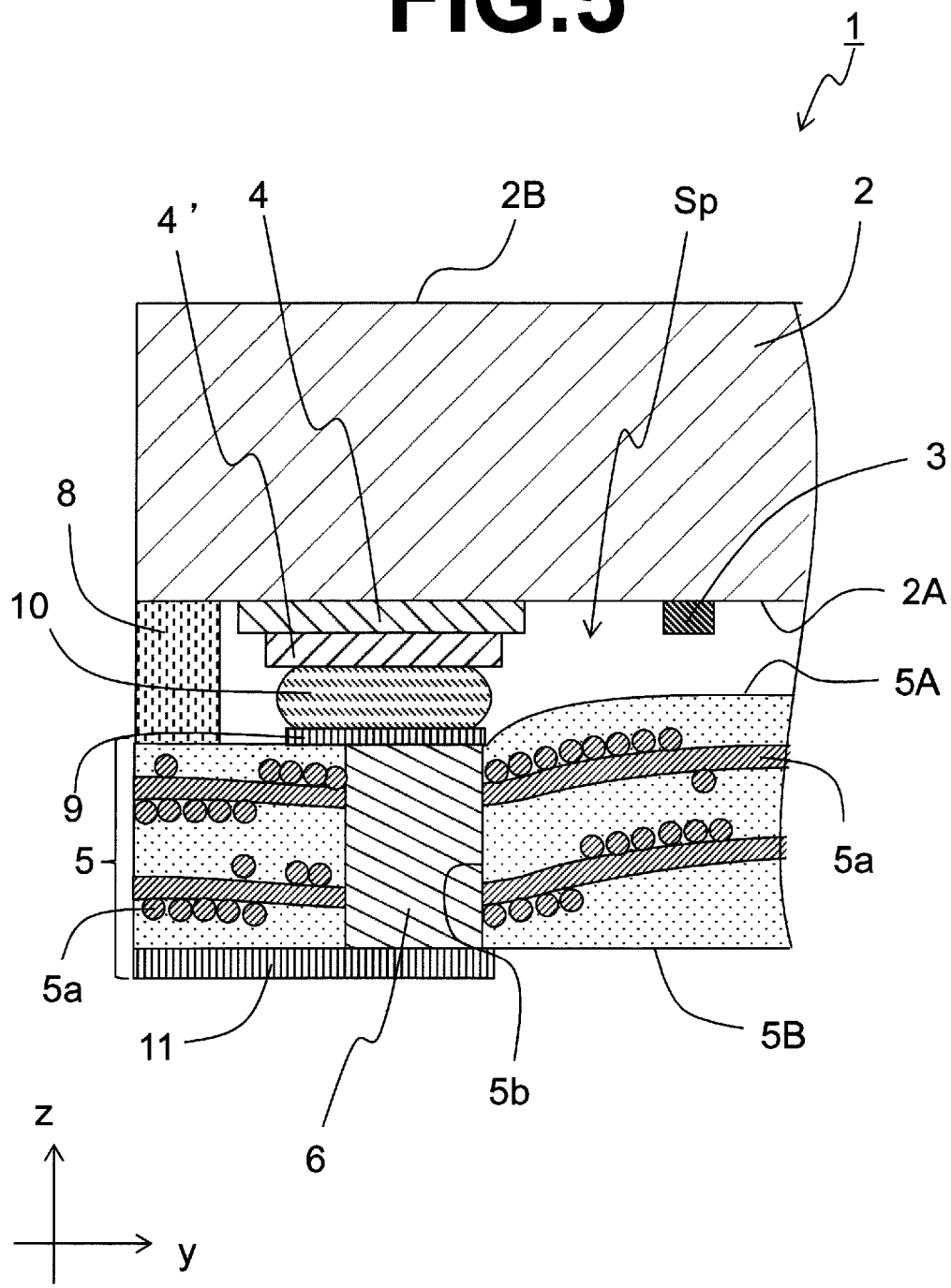
FIG. 5 is an enlarged cross-sectional view enlarging a portion of the SAW device in FIG. 4.

At the cover 5, as shown in FIG. 5, the second electrode pads 9 are arranged on the upper surface 5A, and external terminal electrodes 11 are arranged on the lower surface 5B. The second electrode pads 9 and external terminal electrodes 11 are electrically connected to the via conductors 6. The second electrode pads 9 are connected through the bumps 10 to the electrode pads 4. The external terminal electrodes 11 are connected to a circuit board 100 etc. through second bumps 110. The second electrode pads 9 and external terminal electrodes 11 can be made for example polygonal shapes. Further, for the second electrode pads 9 and external terminal electrodes 11, use can be made of metal layers formed by laminating a plurality of metal materials.

The bumps 10 are formed on the connection electrodes 4' by using an electroless plating method. The bumps 10 are formed by for example copper. The thickness of the bumps 10 can be set so as to become for example 5 μm to 30 μm. The cover 5 is placed on the bumps 10 which are formed on the connection electrodes 4'. The cover 5 is fixed to the piezoelectric substrate 2 by joining the bumps 10 to the second electrode pads 9 by hot press bonding.

Specifically, after the bumps 10 are formed on the connection electrodes 4', for example, they are allowed to stand in a 100° C. to 200° C. formic acid atmosphere for 30 minutes to perform reduction treatment and thereby remove the oxide film formed on the surfaces of the bumps 10. Thereafter, the second electrode pads 9 are made to face the bumps 10 and the bumps 10 are given pressure and heat for hot press bonding. The bumps 10 are pressed by pushing the second major surface 2B of the piezoelectric substrate 2 to the cover 5 side by a press machine in a reduced pressure atmosphere. More specifically, a pressure of for example 20 gf to 100 gf is applied to single places of the bumps 10, and the temperature is set so as to become for example 200° C. to 300° C.

When using metal bumps made of copper as the bumps 10, the bonding strength is higher compared with solder bumps, therefore the diameter in the y-direction can be made smaller. In the case of a structure providing the bumps 10 in the oscillation space Sp as in the present embodiment, the oscillation space Sp can be made smaller, since the diameter of the bumps 10 can be made smaller while maintaining the bonding strength.

Further, at the cover 5, as shown in FIG. 5, the surface 5A (upper surface 5A) which faces the piezoelectric substrate 2 is curved to the excitation electrode 3 side. In other words, the cover 5 is curved to the excitation electrode 3 side with respect to the upper surface 2A of the piezoelectric substrate 2 from the point of contact with the via conductors 6. Note that, in a case where the second electrode pads 9 are provided on the upper surface 5A, the cover 5 may be curved so as to approach the excitation electrode 3 side from the point of contact with the second electrode pads 9 as well. The curve of the cover 5 may be inclined relative to for example the upper surface 2A of the piezoelectric substrate 2. Otherwise, the upper surface 5A of the cover 5 need not be vertical relative to the thickness direction of the via conductors 6.

The sealing resin 8 is arranged between the piezoelectric substrate 2 and the cover 5. The sealing resin 8 is arranged along the periphery of the piezoelectric substrate 2. Due to this, the oscillation space Sp etc. are air-tightly sealed. In the present embodiment, the electrode pads 4 are also arranged on the inner side from the sealing resin 8 and are air-tightly sealed. The sealing resin 8 is configured by for example an epoxy resin, polyimide resin, thermosetting resin or the like. It is sufficient to form the sealing resin 8 on the piezoelectric substrate 2 side before the cover 5 is fixed to the piezoelectric substrate 2 (before the second electrode pads 9 are fixed to the bumps 10).

Figure 10:
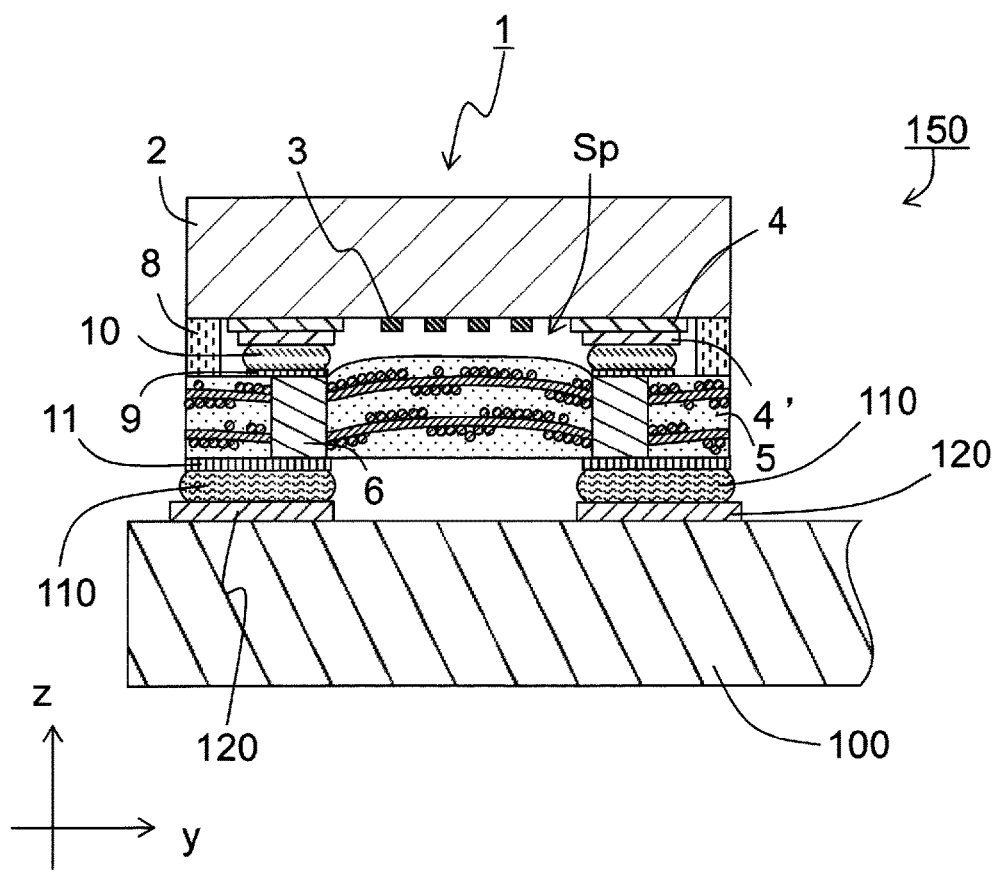
FIG. 10 shows a cross-sectional view of a SAW module according to an embodiment of the present invention and corresponds to the cross-section cut along the line I-I in FIG. 1.

The SAW device 1, as shown in FIG. 10, is mounted through second bumps 110 on the circuit board 100. The second bumps 110 are joined to the external terminal electrodes 11. The second bumps 110 may be solder using lead such as a Pb—Sn alloy solder or may be a lead-free solder such as Au—Sn alloy solder, Au—Ge alloy solder, Sn—Ag alloy solder, or Sn—Cu alloy solder.

Figure 6:
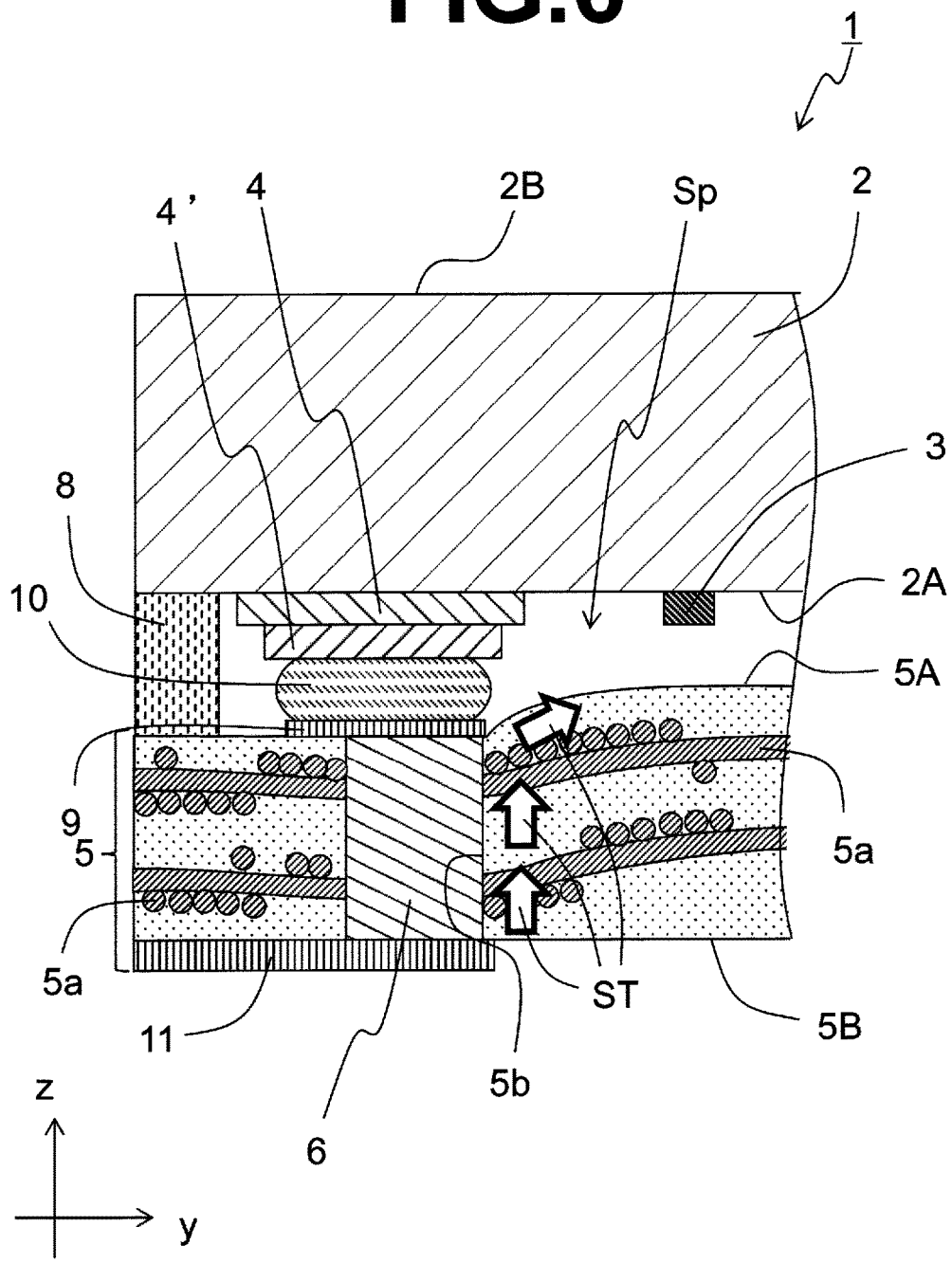
FIG. 6 is a diagram for explaining a mechanism in FIG. 5.

In the SAW device 1 in the present embodiment, the upper surface 5A of the cover 5 is curved toward the excitation electrode 3 side from the point of contact with the via conductors 6. For this reason, for example, when mounting the SAW device 1 on the circuit board 100 or the like, stress applied between the via conductors 6 and the cover 5 can be mitigated. Specifically, as shown in FIG. 6, by the cover 5 curving, stress concentration of stress ST applied to the cover 5 at the time of mounting can be mitigated. As a result, the shock resistance of the cover 5 can be improved. Consequently, the reliability of the SAW device 1 can be improved.

Further, since the cover 5 has a structure which mitigates the stress, gaps do not easily form between the via conductors 6 and the cover 5. For this reason, in the case where the electrode pads 4 are arranged inside the sealing space as in the present embodiment, the air-tightness of the sealing space can be improved.

Further, the heat of the excitation electrodes 3 is sometimes conducted through the electrode pads 4 etc. to the via conductors 6. In that case, thermal stress ends up being generated in the cover 5 due to the difference of thermal expansion coefficient between the via conductors 6 and the cover 5. However, because of the curving of the cover 5, concentration of thermal stress can be mitigated. In other words, the heat resisting property of the cover 5 can be improved, therefore large electric power can be applied to the excitation electrodes 3 and thus the power-handling capability of the SAW device 1 can be improved.

Further, by using an organic substrate as the cover 5 as in the present embodiment, compared with the case where a ceramic board is used, the organic substrate itself easily deforms when impact is added to the cover 5. For this reason, the mechanical shock resistance of the cover 5 can be further improved.

Modification 1 of SAW Device

As shown in FIG. 5 etc., the fibers 5a may contact the via conductors 6 as well. By the fibers 5a contacting the via conductors 6, the stress which is applied to the cover 5 can be easily released to the fibers 5a as well. Further, in a case where the thermal conductivity of the fibers 5a is higher than the thermal conductivity of the base material made of an organic material, by the fibers 5a contacting the via conductors 6, the conduction of heat of the via conductors 6 to the fibers 5a becomes easier, therefore dissipation of heat of the via conductors 6 can be improved.

Further, the fibers 5a may be curved toward the excitation electrode 3 side from the point of contact with the via conductor 6 in the same way as the curve of the upper surface 5A of the cover 5. Due to this, the mechanical strength of the cover 5 can be improved with respect to the thickness direction (z-direction) and surface direction (xy-direction).

Figure 7:
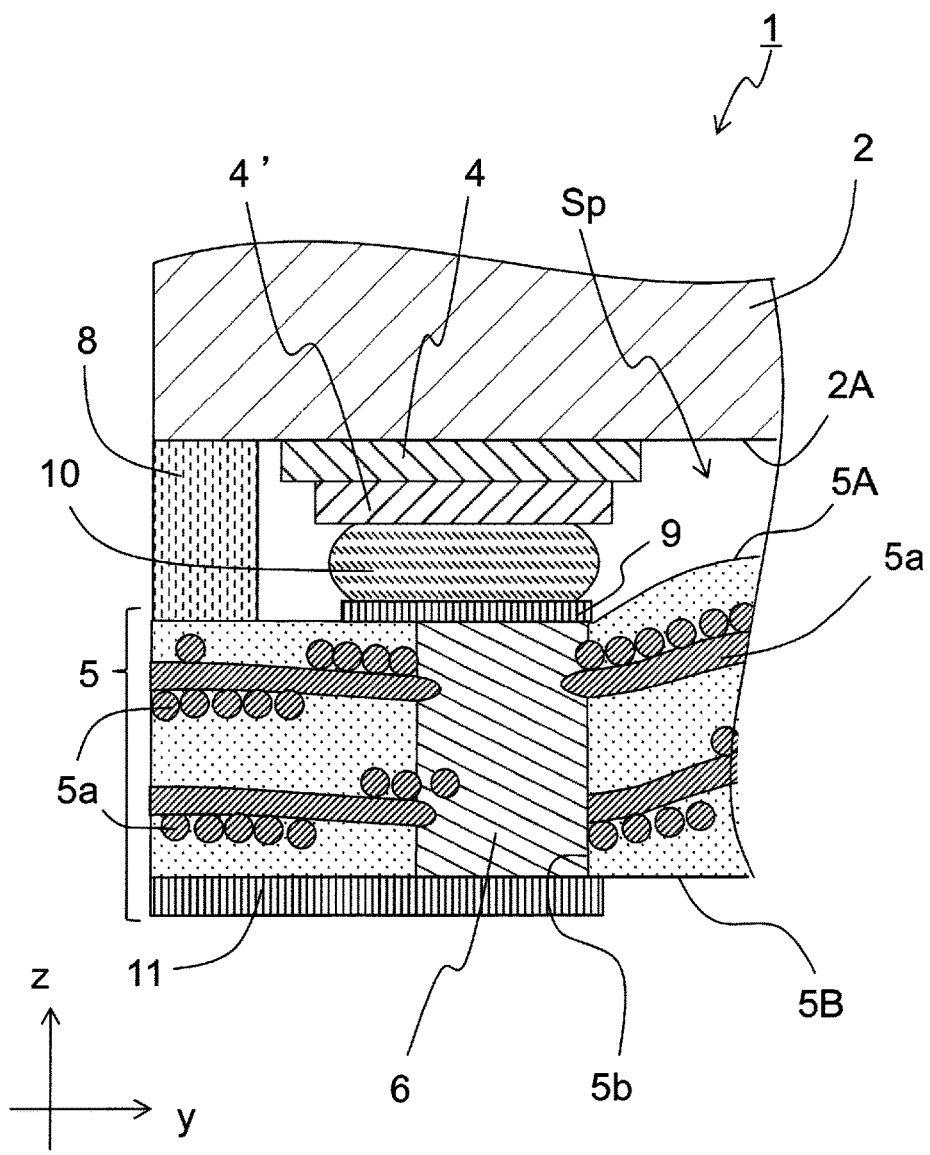
FIG. 7 shows a modification of the SAW device in FIG. 1 and is an enlargement of the cross-section when cut along the line I-I in FIG. 1.

Further, as shown in FIG. 7, portions of the fibers 5a may be buried in the via conductors 6 as well. By portions of the fibers 5a being buried in this way, it becomes harder for the fibers 5a to displace, therefore the mechanical strength of the cover 5 made of an organic substrate can be improved. As a result, deformation of the cover 5 can be made harder.

Modification 2 of SAW Device

Figure 8:
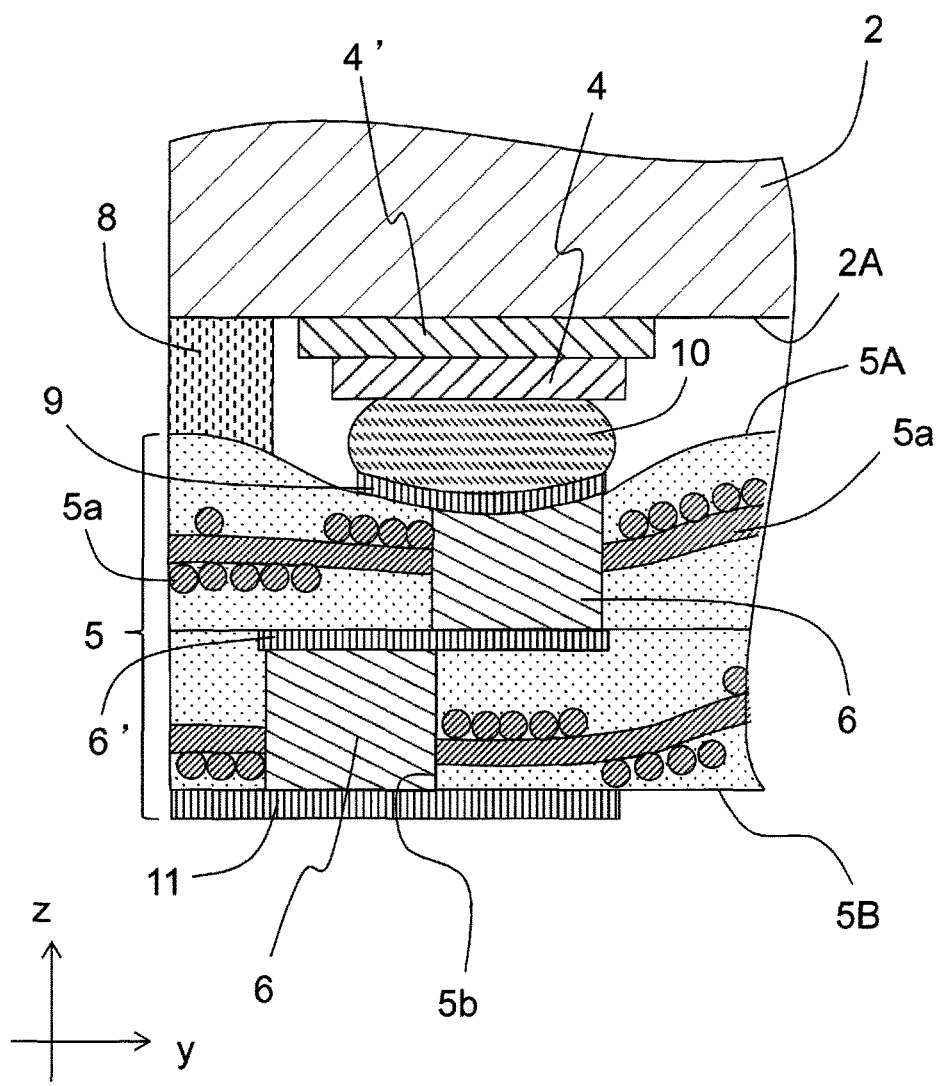
FIG. 8 shows a modification of the SAW device in FIG. 1 and is an enlargement of the cross-section when cut along the line I-I in FIG. 1.

The second electrode pads 9, as shown in FIG. 8, may be curved to the cover 5 side as well. For the second electrode pads 9, use can be made of shapes that are curved more as the further toward the center direction from the periphery. Note that, the SAW device 1 shown in FIG. 8 shows a case where the organic substrate configuring the cover 5 is formed by two layers and a case where a line conductor layer 6' is formed between the layers. The line conductor layer 6' is configured by a conductor such as copper foil.

By that the second electrode pads 9 being curved in this way, they end up contacting the bumps 10 at the curved surfaces, therefore the bonding strength with respect to the surface direction (xy-direction) can be improved.

Further, in the SAW device 1 shown in FIG. 8, the portion in the cover 5 which is positioned on the outer side from the second electrode pads 9 may be curved to the piezoelectric substrate 2 side as well. That is, in the cover 5 at the region where is positioned on the outer side from the second electrode pads 9, the portion contacting the via conductors 6 is curved to the piezoelectric substrate 2 side. By being curved in this way, the stress concentration in the cover 5 can be further mitigated. Further, the curvature on the inner side from the second electrode pad 9 and the curvature on the outer side from the latter may be made different as well. By making the curvature on the inner side of the second electrode pad 9 larger compared with the curvature on the outer side, the stress generated in the cover 5 an be effectively mitigated.

Modification 3 of SAW Device

Figure 9:
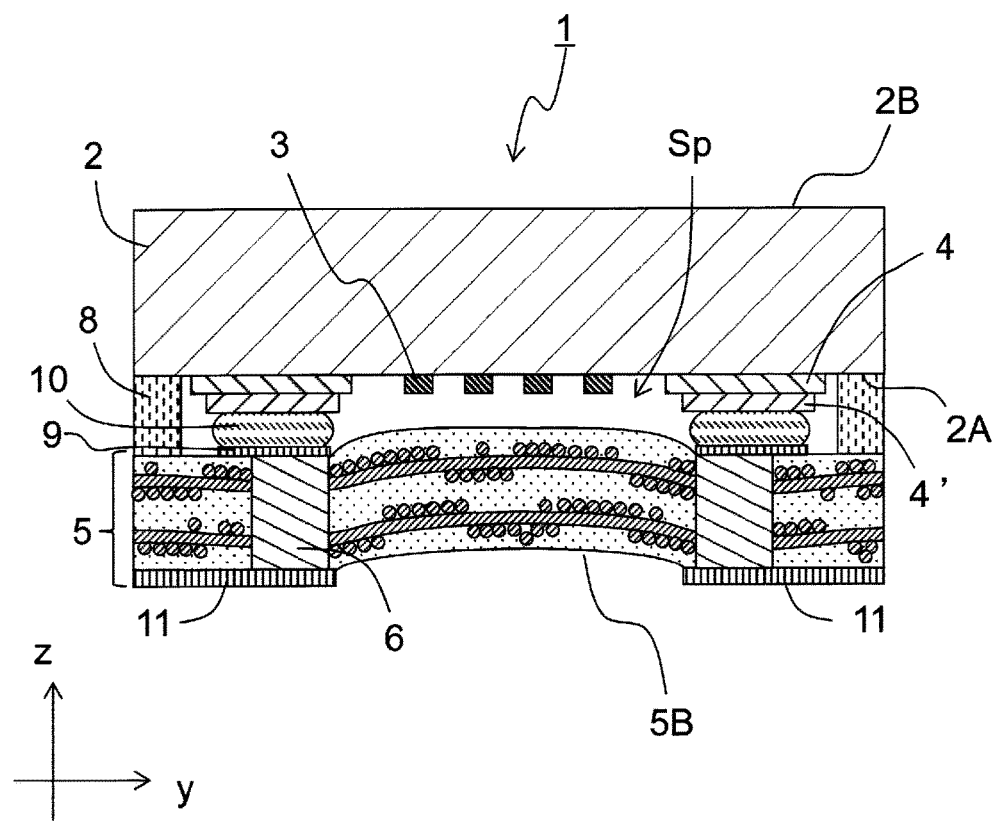
FIG. 9 shows a modification of the SAW device in FIG. 1 and is an enlargement of the cross-section when cut along the line I-I in FIG. 1.

Further, in the cover 5, as shown in FIG. 9, the lower surface 5B may be curved to the piezoelectric substrate 2 side as well. By making the lower surface 5B be curved to the piezoelectric substrate 2 side in this way, when mounting on the circuit board 100, the cover 5 can be made harder to directly contact the circuit board 100.

Modification 4 of SAW Device

Figure 11:
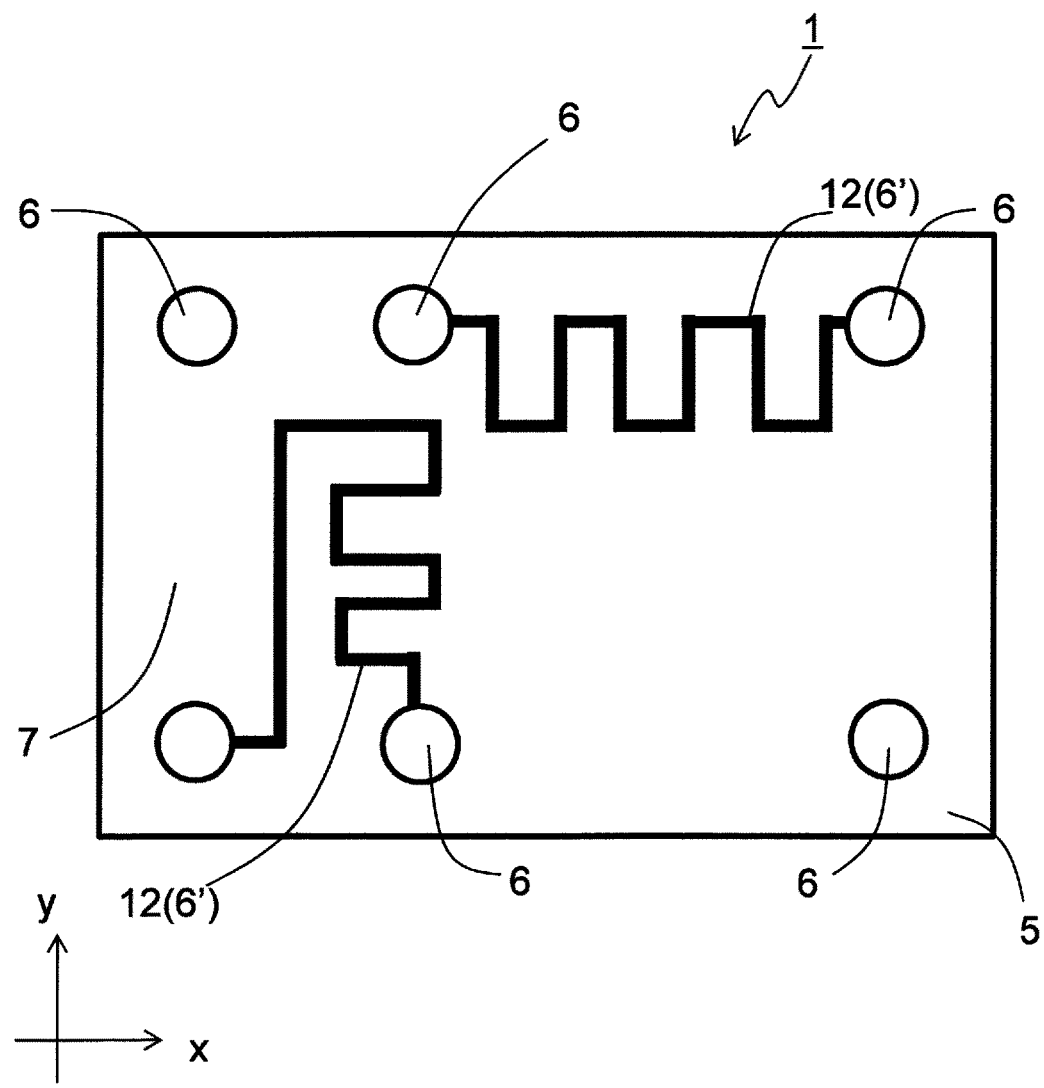
FIG. 11 shows a modification of the SAW device in FIG. 1 and is a plan view in a see-through state.

The cover 5, as shown in FIG. 11, may be provided with circuit patterns 12. The circuit patterns 12 are electrically connected to the electrode pads 4, and portions of them are for example formed in spiral shapes, formed in rectangular shapes, or formed in meander shapes. By configuring it in this way, the circuit pattern 12 is provided with an inductor component. By this type circuit pattern 12, the filter characteristic of the SAW device 1 can be adjusted and heat generated in the excitation electrode 3 can be radiated. The circuit patterns 12 only have to be conductor. For example copper etc. can be used.

Although the circuit patterns 12 may be formed on the upper surface 5A of the cover 5 as well, they may be for example configured by a line conductor layer 6' which is formed between layers of the organic substrate configured by a plurality of layers as shown in FIG. 8 as well. FIG. 11 is a plan view when viewing the cover 5 in a transparent state in the case where the circuit patterns 12 are configured by the line conductor layer 6'.

By configuring the circuit patterns 12 by the line conductor layer 6', the circuit patterns 12 can be installed inside the cover 5. In this case, the circuit patterns 12 are not exposed to the outside, therefore deterioration of the electrodes can be suppressed. Further, by connecting line conductor layers 6' which exist among a plurality of layers by the via conductors, the circuit patterns 12 can be formed over a plurality of layers, therefore a degree of freedom of design can be raised.

The line conductor layer 6' may be extended to the inside of the second electrode pads 9 or may be extended to the outside. In a case extending this to the inside, the cover 5 can be reinforced so as to maintain the sealing space by the line conductor layer 6'. In a case extending this to the outside, risk of formation of an unrequired parasitic capacitance by the circuit pattern 12 can be suppressed.

Such circuit patterns 12 may be electrically connected to the electrode pads 4 at the ground potential as well. In this case, the circuit patterns 12 can be used as a matching circuit of the reception filter and transmission filter. Further, when providing the circuit patterns 12 between the parallel resonator of the transmission filter and the ground, it can be made function as the inductor for adjusting the attenuation pole.

Modification 5 of SAW Device

Figure 12:
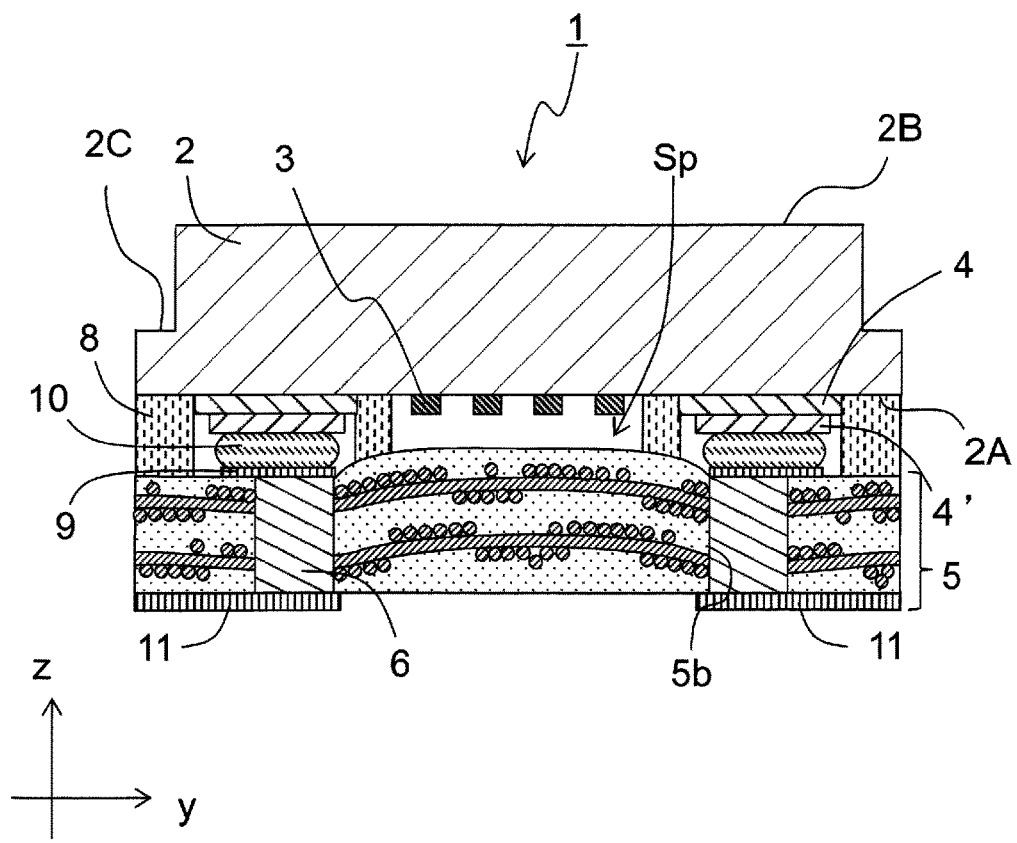
FIG. 12 shows a modification of the SAW device in FIG. 1 and is an enlargement of the cross-section when cut along the line I-I in FIG. 1.

The piezoelectric substrate 2, as shown in FIG. 12, may be provided with a step portion 2C on the second major surface 2B (hereinafter, also referred to as the lower surface 2B) in the peripheral part. The step portion 2C is configured by the lower surface of the step portion 2C being positioned on the upper surface 2A side. That is, in the piezoelectric substrate 2, the upper surface 2A side has no step portion 2C and becomes the same level while the lower surface 2B is formed with the step portion 2C with a thickness which becomes thinner at the peripheral part. Such a step portion 2C is provided on the outer side from the region in which the excitation electrodes 3 are formed on the upper surface 2A. The step portion 2C becomes low in strength compared with the other portions in the piezoelectric substrate 2. Due to this, stress which is generated in the piezoelectric substrate 2 at the time of joining with the cover 5 or the time of mounting the SAW device 1 on the circuit board which will be explained later can be concentrated to the step portion 2C and be released. For this reason, in the region of the piezoelectric substrate 2 in which the excitation electrodes 3 are formed, generation of unintended stress is suppressed thereby obtaining the desired oscillation characteristic, and breakage is suppressed. Therefore, a SAW device 1 having a high reliability can be provided.

If this type of step portion 2C is provided on the outer side from the region in which the electrode pads 4 are formed on the upper surface 2A, electrical connection of the electrode pads 4 and the via conductors 6 which are connected to them can be stably secured.

The side surface configuring the step portion 2C may exhibit a tapered state expanding to the outside. By employing such a shape, the stress can be released to the outside of the region in which the excitation electrodes 3 are formed.

The arithmetic mean roughness of the portion in the step portion 2C which is positioned on the upper surface 2A side may be made larger compared with the other portions on the lower surface 2B. Due to this, the stress added to the piezoelectric substrate 2 can be concentrated to the portion in the step portion 2C which is positioned on the upper surface 2A side. Further, after the mounting on the circuit board 100 explained later, at the time of molding by resin, the joining force with the resin can be raised in the step portion 2C which is hard for the resin to reach.

Note that, in FIG. 12, the sealing resin 8 is formed so as to surround the electrode pads 4. By employing such a configuration, the bumps 10 can be isolated from the excitation electrodes 3, and the electrical connection of the electrode pads 4, bumps 10, and via conductors 6 can be protected.

Figure 13A:
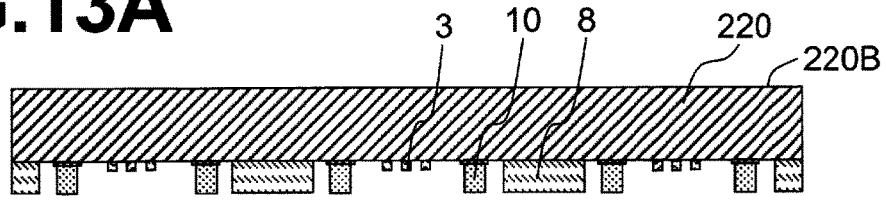
FIGS. 13A to 13D are cross-sectional views showing a manufacturing steps for manufacturing a SAW device shown in FIG. 12 and show principal parts for the different steps.

An example of the method of production of this type of SAW device 1 will be explained by using FIGS. 13A to 13D. First, as shown in FIG. 13A, the excitation electrodes 3, electrode pads 4, sealing resin 8, bumps 10, etc. are formed in the different regions of a piezoelectric substrate wafer 220.

Figure 13B:
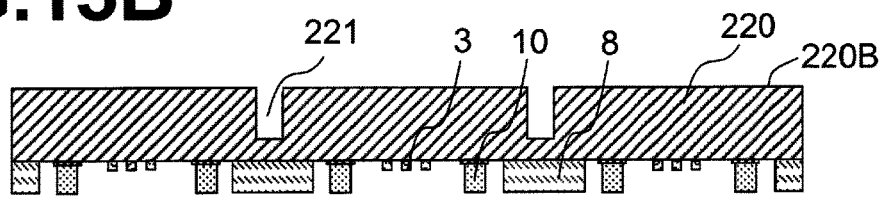

Next, as shown in FIG. 13B, grooves 221 are formed in a lower surface 220B of the piezoelectric substrate wafer 220. The grooves 221 are formed in portions corresponding to regions in which the sealing resin 8 is formed so that regions forming the SAW devices 1 are partitioned from each other. Note that, in this example, the grooves 221 were formed after forming the excitation electrodes 3 etc., but the excitation electrodes 3 etc. may be formed after forming the grooves 221 as well.

Figure 13C:
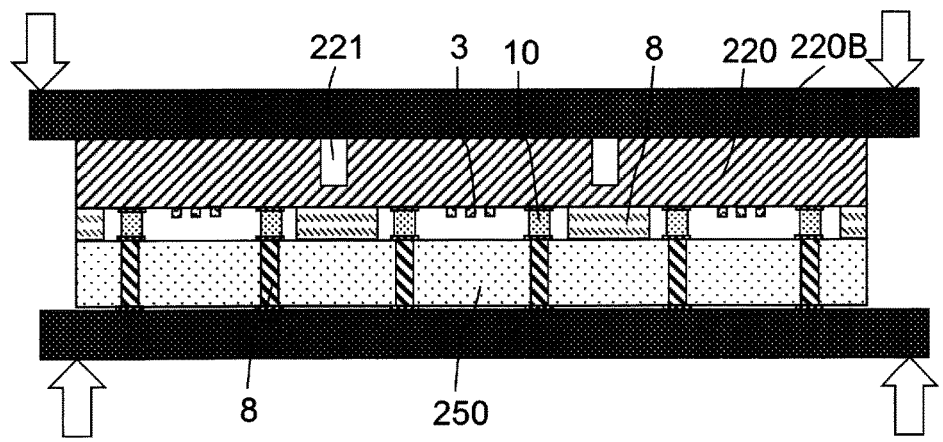

Next, as shown in FIG. 13C, the piezoelectric substrate wafer 220 and cover assembled substrate 250 are joined by hot press bonding. The bumps 10 of the piezoelectric substrate 220 and the via conductors 6 of the cover assembled substrate 250 can be electrically connected at the same time with this bonding.

Figure 13D:
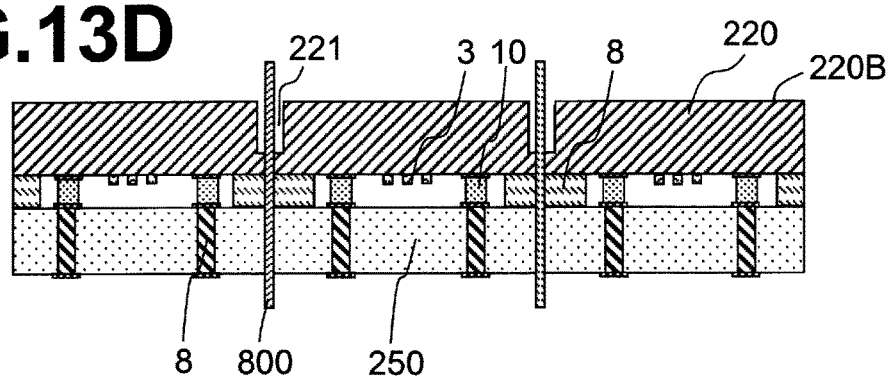

Subsequently, as shown in FIG. 13D, the assembly is diced along the grooves 221 by dicing blades 800 to obtain the SAW devices 1 as shown in FIG. 12. By making the grooves 221 broader than the width of the dicing blades 800 and about a half of the thickness of the piezoelectric substrate wafer 220, the stress generated in the piezoelectric substrate wafer 220 due to dicing can be made smaller.

Modification 6 of SAW Device

Figure 14:
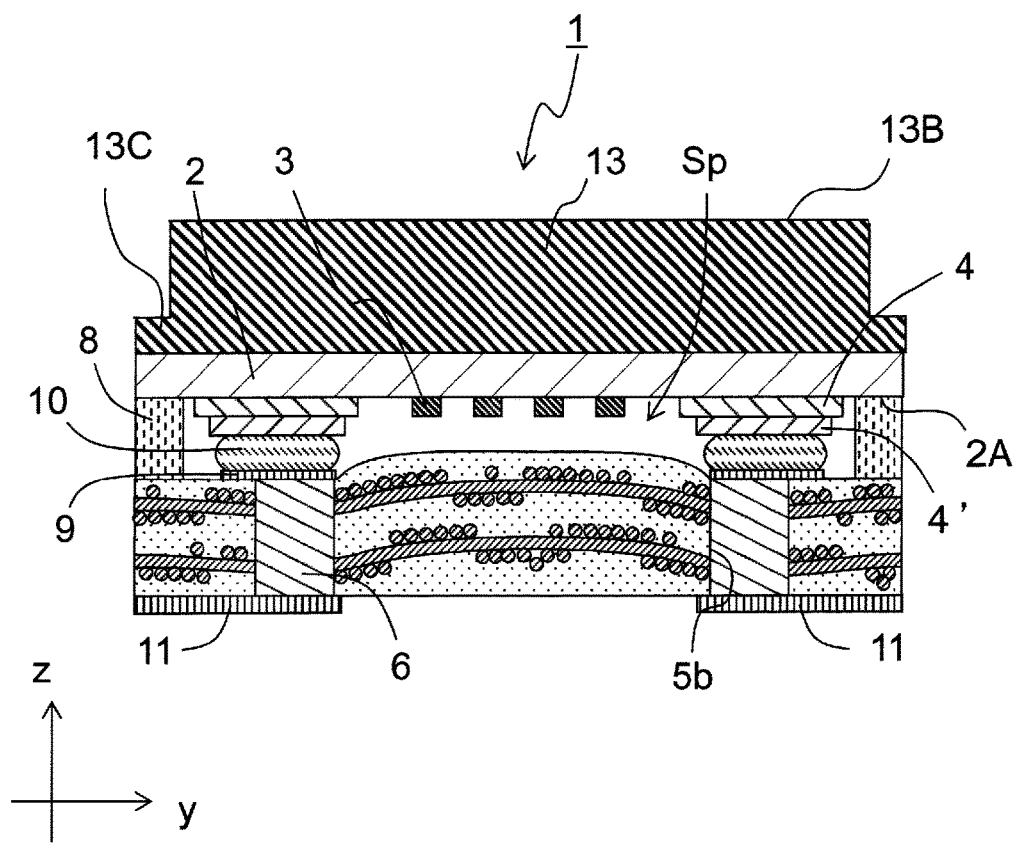
FIG. 14 shows a modification of the SAW device in FIG. 1 and is an enlargement of the cross-section when cut along the line I-I in FIG. 1.

The SAW device 1, as shown in FIG. 14, may be provided with a supporting substrate 13 on the lower surface 2B side of the piezoelectric substrate 2. So far as the supporting substrate 13 is joined to the piezoelectric substrate 2 and can support the piezoelectric substrate 2, its material is not limited. For example, use can be made of a material having a higher elastic modulus and lower thermal expansion coefficient than the piezoelectric substrate 2. As such a material, silicon and sapphire can be exemplified.

By providing the supporting substrate 13, the piezoelectric substrate 2 can be protected from impact from the outside. In a case where the supporting substrate 13 is configured by a material having a lower thermal expansion coefficient than that of the piezoelectric substrate 2, deformation of the piezoelectric substrate 2 due to a change of ambient temperature is suppressed, and stress can be applied to the upper surface 2A of the piezoelectric substrate 2. Due to this, fluctuation of the oscillation characteristic by the excitation electrodes 3 due to a change of temperature can be suppressed.

The piezoelectric substrate 2 and the supporting substrate 13 may be joined by activating them at normal temperature by irradiating the bonding surface with ion beams or neutron beams, then bringing them into direct contact. In this case, no heat or stress is applied when joining the piezoelectric substrate 2 and the supporting substrate 13, therefore unintended application of stress to the piezoelectric substrate 2 can be suppressed.

Further, in the peripheral part of the supporting substrate 13, a second step portion 13C may be provided as well. The lower surface of the second step portion 13C is positioned on the piezoelectric substrate 2 side. That is, in the supporting substrate 13, there is no step on the surface on the side contacting the piezoelectric substrate 2 so the surface is flat, while a step portion 13C is formed on the lower surface 13B resulting in the thickness becoming thinner in the peripheral part. The second step portion 13C, in the same way as the step portion 2C, enables the stress to be released to the outside of the oscillation space Sp by provision at the outside of the region in which the excitation electrodes 3 are formed on the upper surface 2A of the piezoelectric substrate 2.

Note that, in a case where the supporting substrate 13 and the piezoelectric substrate 2 are joined by so-called room temperature bonding, warping is not caused at the time of bonding the two. However, by heating when joining the cover 5 by hot press-bonding, warping greater than that in a case where the piezoelectric substrate 2 is alone is liable to be caused. For this reason, in a case where the SAW device 1 is provided with the supporting substrate 13, it is necessary to use the second step portion 13C to absorb unintended stress at the time of joining the cover 5.

Configuration of SAW Module

A SAW module 150, as shown in FIG. 10, is provided with the SAW device 1 and the circuit board 100 provided with pads 120 which are to be connected to the external terminal electrodes 11 of the SAW device 1. In the circuit board 100, the SAW device 1 is electrically connected to a power amplifier module or IC etc. The SAW device 1 is mounted through the second bumps 110 on the pads 120.

The second bumps 110 are configured by a material having a lower melting point than the melting point of the bumps 10. Due to this, melting of the bumps 10 due to heating when mounting the SAW device 1 on the circuit board 100 can be suppressed. As a result, the reliability of the SAW module 150 can be improved.

Further, the second bumps 110 may be given a larger diameter (diameter in the y-direction) than the bumps 10.

Due to this, mounting errors of the SAW device 1 can be suppressed, and the oscillation space Sp can be kept from becoming larger.

REFERENCE SIGNS LIST 1 acoustic wave (SAW) device
2 piezoelectric substrate
2A upper surface
2B second major surface
3 excitation electrodes (comb-shaped electrodes)
3a bus bar electrode
3b electrode finger
4 electrode pad
4' connection electrode
5 cover
5a fiber
5b via hole
5A upper surface (surface facing piezoelectric substrate)
5B lower surface
6 via conductor
7 line
8 sealing resin
9 second electrode pad
10 bump
11 external terminal electrode
12 circuit pattern
13 supporting substrate
100 circuit board
110 second bump
120 pad
150 acoustic wave (SAW) module

The invention claimed is:

1. An acoustic wave device, comprising:
a piezoelectric substrate;
an excitation electrode on the piezoelectric substrate;
an electrode pad arranged on the piezoelectric substrate and electrically connected with the excitation electrode; and
a cover arranged on the piezoelectric substrate so that a oscillation space is arranged between the cover and the excitation electrode, wherein
the cover, in an internal portion, comprises a via conductor electrically connected to the electrode pad and its surface facing the piezoelectric substrate is curved so as to approach the excitation electrode side,
the cover is an organic substrate including fibers extending in the surface direction, and
a portion of the fibers is buried in the via conductor.

2. The acoustic wave device according to claim 1, wherein the fibers are curved to the excitation electrode side.

3. The acoustic wave device according to claim 1, wherein the cover has second electrode pad arranged on the surface facing the piezoelectric substrate and electrically connected to the via conductor and
a bump is arranged between the second electrode pad and the electrode pad.

4. The acoustic wave device according to claim 3, wherein the second electrode pad is curved to the cover side.

5. The acoustic wave device according to claim 1, wherein the piezoelectric substrate has a step portion in a peripheral part.

6. The acoustic wave device according to claim 1, comprising a supporting substrate which is joined to a lower surface of the piezoelectric substrate and is made of a material having a higher elastic modulus than that of the material configuring the piezoelectric substrate, wherein the supporting substrate has a second step portion in a peripheral part.

7. An acoustic wave module comprising:
an acoustic wave device according to any of claims 1 and 2 to 6 and
a circuit board provided with a pad electrically connected to the via conductor, wherein
the acoustic wave device is mounted through second bump on the pad.

8. The acoustic wave module according to claim 7, wherein the second bump has a lower melting point than a melting point of the bump.

9. An acoustic wave device, comprising:
a piezoelectric substrate;
an excitation electrode on the piezoelectric substrate;
an electrode pad arranged on the piezoelectric substrate and electrically connected with the excitation electrode; and
a cover arranged on the piezoelectric substrate so that a oscillation space is arranged between the cover and the excitation electrode, wherein
the cover, in an internal portion, comprises a via conductor electrically connected to the electrode pad and its surface facing the piezoelectric substrate is curved so as to approach the excitation electrode side,
the cover comprises
a first portion, and
a second portion which is nearer to the excitation electrode than the first portion since the surface facing the piezoelectric substrate is curved, and
the second portion is thicker than the first portion.

10. The acoustic wave device according to claim 1, wherein the cover comprises a circuit pattern.

* * * * *